United States Patent
Fujimoto

(10) Patent No.: US 9,263,629 B2
(45) Date of Patent: Feb. 16, 2016

(54) SEMICONDUCTOR LIGHT EMITTING DEVICE AND LIGHT COUPLING DEVICE

(71) Applicant: KABUSHIKI KAISHA TOSHIBA, Minato-ku (JP)

(72) Inventor: Kenji Fujimoto, Ishikawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 178 days.

(21) Appl. No.: 14/020,355

(22) Filed: Sep. 6, 2013

(65) Prior Publication Data
US 2014/0284548 A1 Sep. 25, 2014

(30) Foreign Application Priority Data
Mar. 22, 2013 (JP) .................... 2013-061143

(51) Int. Cl.
*H01L 31/167* (2006.01)
*H01L 33/06* (2010.01)

(52) U.S. Cl.
CPC ..................... *H01L 33/06* (2013.01)

(58) Field of Classification Search
CPC . H01L 31/035236; H01L 33/06; H01L 33/08; H01L 33/24; H01L 33/42; H01S 5/34326; H01S 5/34366; H01S 5/34313
See application file for complete search history.

(56) References Cited

U.S. PATENT DOCUMENTS

| 7,372,066 B2 | 5/2008 | Sato et al. |
| 7,595,508 B2 | 9/2009 | Otsubo et al. |
| 2009/0256165 A1 | 10/2009 | Smith et al. |
| 2011/0241564 A1* | 10/2011 | Shimizu et al. ............... 315/291 |
| 2012/0235191 A1 | 9/2012 | Ishida et al. |
| 2013/0243024 A1* | 9/2013 | Hara ..................... 372/45.012 |
| 2013/0248819 A1 | 9/2013 | Aihara |

FOREIGN PATENT DOCUMENTS

| JP | H04-342176 A | 11/1992 |
| JP | H07-015036 A | 1/1995 |
| JP | 2007-012688 A | 1/2007 |
| JP | 2012-039049 A | 2/2012 |
| JP | 2012-119585 A | 6/2012 |
| JP | 2012-186194 A | 9/2012 |
| JP | 2012-199293 A | 10/2012 |

OTHER PUBLICATIONS

Japanese Office Action issued on Apr. 14, 2015 in corresponding Japanese Application No. 2013-061143, along with English translation thereof.
Japanese Office Action issued Nov. 13, 2015 in corresponding Japanese Application No. 2013-061143, along with English translation thereof.

* cited by examiner

*Primary Examiner* — Jae Lee
*Assistant Examiner* — Mohammed R Alam
(74) *Attorney, Agent, or Firm* — White & Case LLP

(57) ABSTRACT

According to one embodiment, a semiconductor light emitting device includes a semiconductor laminated body provided on a semiconductor substrate. The semiconductor laminated body includes a light emitting layer. The light emitting layer includes a quantum well structure made by alternately laminating n (an integer of not less than 1) well layers and (n+1) barrier layers and emits light with a peak wavelength of 650 nm to 1000 nm. Each of the well layers has a thickness of smaller than 15 nm. Each of the barrier layers has a thickness of 15 nm to 50 nm.

8 Claims, 11 Drawing Sheets

SEMICONDUCTOR LIGHT EMITTING DEVICE AND LIGHT COUPLING DEVICE

CROSS REFERENCE TO RELATED APPLICATION

This application is based upon and claims the benefit of priority from the prior Japanese Patent Application No. 2013-061143, filed on Mar. 22, 2013, the entire contents of which are incorporated herein by reference.

FIELD

Embodiments described herein relate generally to a semiconductor light emitting device and a light coupling device.

BACKGROUND

Light coupling devices have a semiconductor light emitting device to emit a light signal with a wavelength range from red light to infrared light, and a light receiving device such as a Si-light receiving device to convert the light signal into an electric signal and output the electric signal. The light coupling devices enable signals to be transmitted with electrical insulation between an input terminal and an output terminal.

The light coupling devices to transmit high-speed signals are increasingly expanding their application in industrial instruments, communication devices, and the like.

Reduction of a time constant of the light receiving device, or a circuit configured to detect change of an output to speed up changeover of an output voltage enables the light receiving device to be driven at high speed.

On the other hand, since the light emitting device emits light by applying a forward voltage, a junction capacitance of the light emitting device is larger than that of the light receiving device, and thereby it is hard to improve the response speed of the light emitting device.

DETAILED DESCRIPTION

Figure 1A:
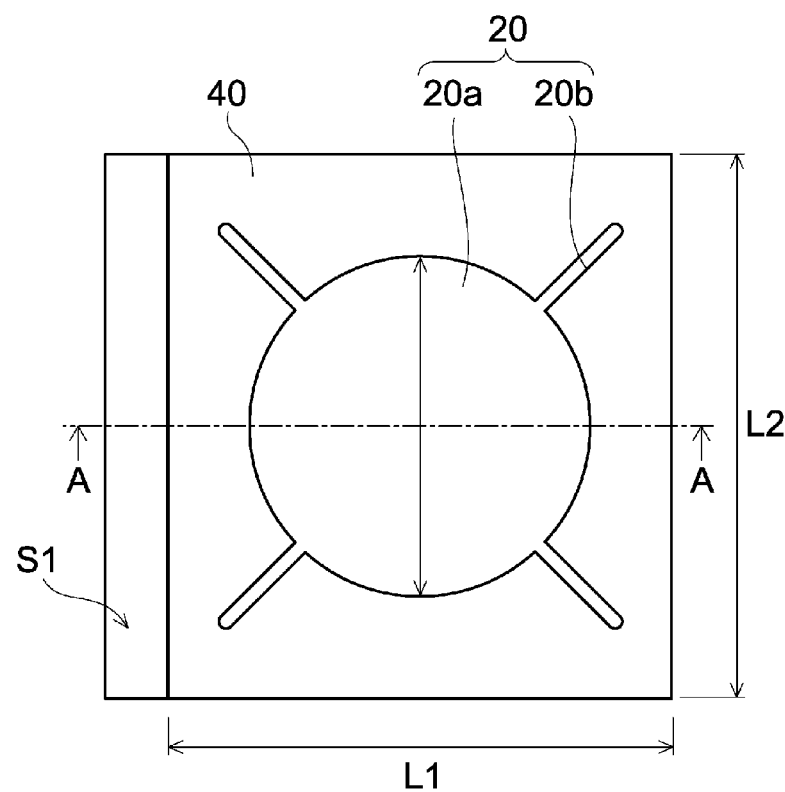
FIG. 1A is a schematic plan view showing a semiconductor light emitting device according to an embodiment.

According to one embodiment, a semiconductor light emitting device includes a semiconductor laminated body provided on a semiconductor substrate. The semiconductor laminated body includes a light emitting layer. The light emitting layer includes a quantum well structure made by alternately laminating n (an integer of not less than 1) well layers and (n+1) barrier layers and emits light with a peak wavelength of 650 nm to 1000 nm. Each of the well layers has a thickness of smaller than 15 nm. Each of the barrier layers has a thickness of 15 nm to 50 nm.

Hereinafter, an embodiment will be described with reference to the drawings. In the drawings, same reference characters denote the same or similar portions. The same numbers are given to the same portions in the drawings, and the detailed description of the same portions will be arbitrarily omitted, and the different portions will be described.

Figure 1B:
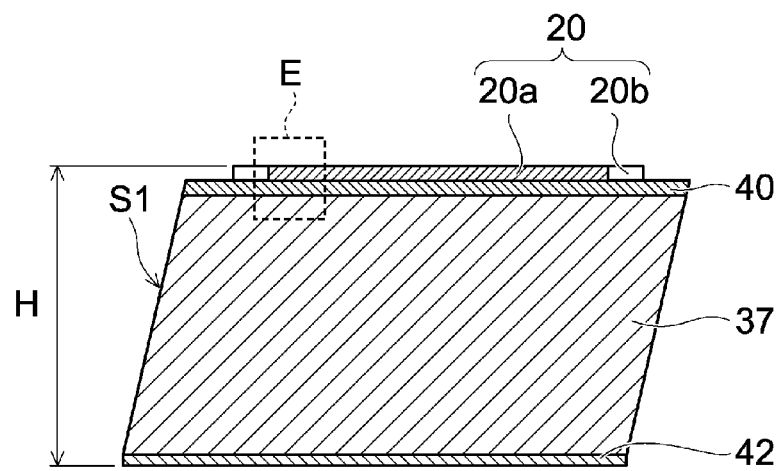
FIG. 1B is a schematic sectional view showing the semiconductor light emitting device taken along a line A-A according to the embodiment.

FIG. 1A is a schematic plan view showing a semiconductor light emitting device of an embodiment, and FIG. 1B is a schematic sectional view showing a semiconductor light emitting device taken along a line A-A.

The semiconductor light emitting device has a semiconductor substrate 37, a semiconductor laminated body 40 which is provided on the semiconductor substrate 37 and includes a light emitting layer, a first electrode 20, and a second electrode 42.

The first electrode 20 includes a circular pad portion 20a. In addition, the first electrode 20 may further include linear protruding portions 20b in the directions of the diagonal lines of a chip. The configuration of the first electrode 20 causes the light emitting layer to emit at wide region, in a planar view, so as to increase the light output.

The second electrode 42 is provided on the rear surface of the semiconductor substrate 37 to adhere to the wiring portions of mounting members.

The crystal growth plane of the semiconductor substrate 37 may be a plane which is tilted 3 to 20 degrees from a low-index plane, for example. A tilted substrate makes it easy to improve the impurity doping efficiency into the semiconductor laminated body 40, and thereby the optical property, and so on can be improved. Separation of the chip by cleavage causes a side surface S1 of the chip to tilt as shown in FIG. 1B.

A length L1 in the lateral direction and a length L2 in the longitudinal direction of the chip are respectively 150 μm, for example. In addition, a height H of the chip is 100 μm, for example.

Figure 2A:
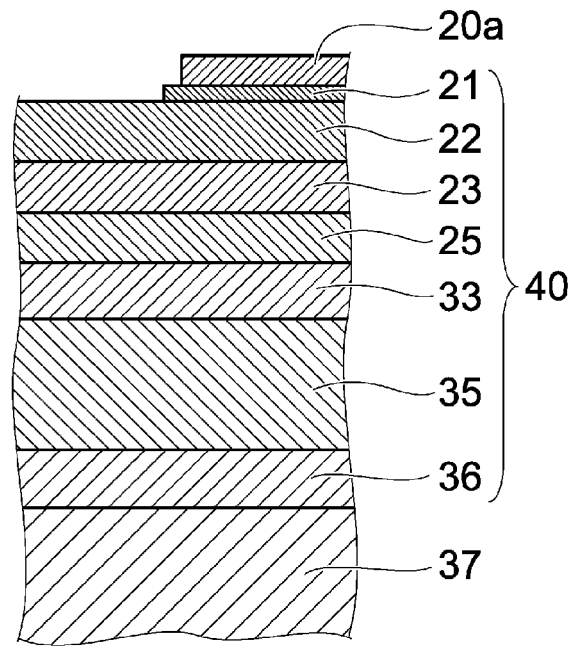
FIG. 2A is an enlarged schematic sectional view showing a semiconductor laminated body of the semiconductor light emitting device according to the embodiment.
Figure 2B:
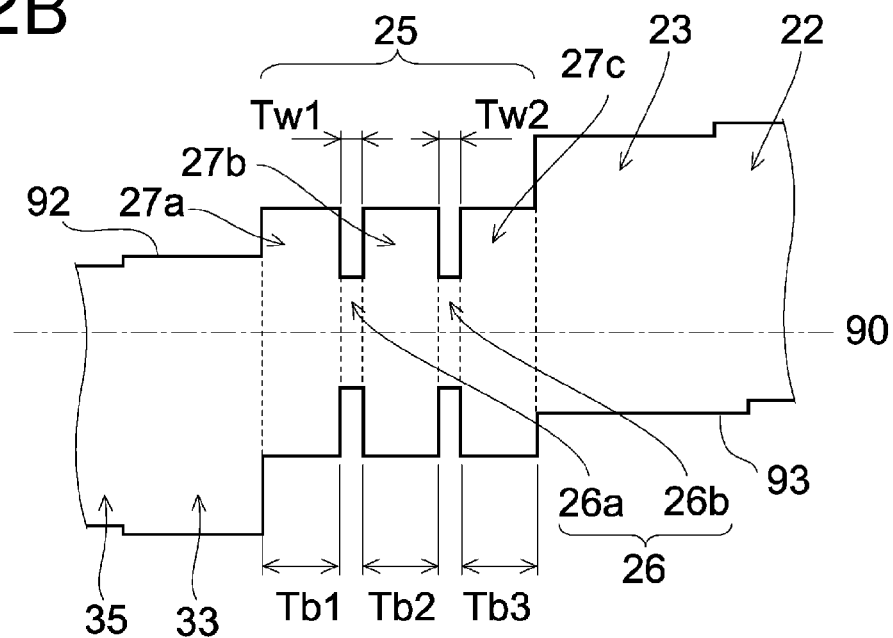
FIG. 2B is a diagram showing a band structure of a quantum well structure of the semiconductor laminated body according to the embodiment.

FIG. 2A is an enlarged schematic sectional view showing an E portion of the semiconductor laminated body, and FIG. 2B is a diagram showing a band structure of a quantum well structure.

The semiconductor laminated body 40 has a light emitting layer 25. The light emitting layer 25 includes a quantum well structure including well layers 26 of n layers (n: an integer of 1 or more) and barrier layers 27 of (n+1) layers which are alternately laminated with the well layers 26. The light emitted from the light emitting layer 25 has a peak wavelength in the range of 650 to 1000 nm.

In the following description, the light emitting layer 25 is made up of $In_xAl_yGa_{1-x-y}As$ ($0 \le x < 1$, $0 \le y \le 1$, $x+y \le 1$), for example, but the composition of the light emitting layer 25 is not limited to $In_xAl_yGa_{1-x-y}As$. When the light emitting layer 25 is made up of $Al_yGa_{1-y}As$ ($0 \leq y \leq 0.46$), the light emitting layer 25 emits light with a peak wavelength of approximately 630 to 870 nm. Adding indium (In) as an element of III group facilitates the light emission in a peak wavelength of not less than 800 nm.

The semiconductor substrate 37 is an n-type GaAs, for example. The donor concentration of the semiconductor substrate 37 is $1 \times 10^{18}$ cm$^{-3}$, for example. The semiconductor laminated body 40 has a buffer layer 36, a reflecting layer 35, an n-type clad layer 33, the light emitting layer 25, a p-type clad layer 23, a p-type current spreading layer 22, and a p-type contact layer 21 which are in sequential order from the semiconductor substrate 37 side. The semiconductor laminated body 40 may be formed using MOCVD (Metal Organic Chemical Vapor Deposition) method or MBE (Molecular Beam Epitaxy) method, for example.

The buffer layer 36 is a GaAs with a thickness of 0.5 μm and a donor concentration of $5 \times 10^{17}$ cm$^{-3}$, for example. The reflecting layer 35 is a Bragg reflector in which 20 pairs of $In_{0.5}Al_{0.5}P$ and $Al_{0.2}Ga_{0.8}As$ are laminated, for example. The reflecting layer 35 reflects the light which goes below toward the upper light extraction surface to improve light extraction efficiency.

The n-type clad layer 33 is $In_{0.5}(Ga_{0.4}Al_{0.6})_{0.5}P$ with a thickness of 0.6 μm and a donor concentration of $1 \times 10^{18}$ cm$^{-3}$, for example. The p-type clad layer 23 is $In_{0.5}(Ga_{0.4}Al_{0.6})_{0.5}P$ with a thickness of 0.6 μm and an acceptor concentration of $8 \times 10^{17}$ cm$^{-3}$, for example.

The p-type current spreading layer 22 is $Al_{0.6}Ga_{0.4}As$ with a thickness of 2.5 μm and an acceptor concentration of $2 \times 10^{18}$ cm$^{-3}$, for example. The p-type contact layer 21 is GaAs with a thickness of 0.01 μm and an acceptor concentration of $2 \times 10^{18}$ cm$^{-3}$, for example. The conductivity types of the respective layers may be the reverse conductivity types, respectively, and the materials, the impurity concentrations, and the thicknesses of the respective layers are not particularly limited.

The light emitting layer 25 has the well layers 26 and the barrier layers 27. The well layers 26 are non-doped $Al_{0.06}Ga_{0.94}As$, and each of the well layers 26 has a thickness of not more than 10 nm, for example. The barrier layers 27 are non-doped $Al_{0.5}Ga_{0.5}As$, and each of the barrier layers 27 has a thickness of not less than 15 nm and not more than 50 nm, for example.

FIG. 2B is a diagram showing a band structure of the quantum well structure including the well layers 26 (the number n of the layers is 2) and the barrier layers 27 (the number (n+1) of the layers is 3) sandwiching the well layers 26.

A conduction band 92 and a valence band 93 are shown so that quasi-Fermi levels 90 are conformed. Electrons and holes are stored in each of two well layers 26a, 26b. When thicknesses Tb1, Tb2, Tb3 of respective barrier layers 27a, 27b, and 27c are small, the quantum efficiency becomes high, but carriers are stored in a thin region between the p-type clad layer 23 and the n-type clad layer 33 to cause the junction capacitance large.

On the other hand, when the thicknesses Tb1, Tb2, Tb3 of the respective barrier layers 27a, 27b, 27c are large, carriers are stored in a thick region between the p-type clad layer 23 and the n-type clad layer 33 to cause the junction capacitance small. But, since overlapping of the wave functions becomes small, the quantum efficiency decreases and a forward voltage VF increases.

Figure 3:
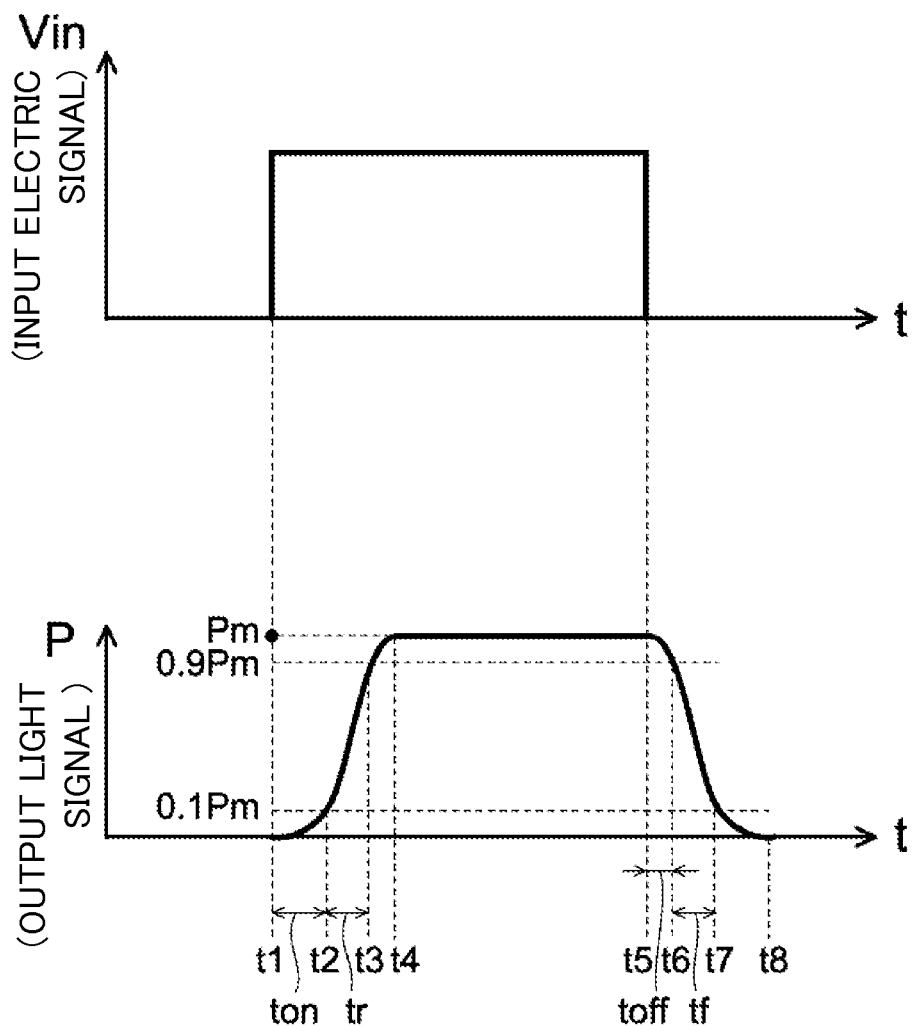
FIG. 3 is a schematic diagram showing a waveform of an output light signal for an input electric signal.

FIG. 3 is a schematic diagram showing a waveform of an output light signal P for an input electric signal Vin.

The semiconductor light emitting device 10 is driven by the input electric signal Vin. When the input electric signal Vin is applied at a time t1, carriers begin to be stored in the well layers 26 of the semiconductor light emitting device 10. It takes a light emission delay time to start an output of the light signal at a time t2. The light signal rises up, and reaches approximately a peak value Pm at a time t4.

The input electric signal Vin begins to drop at a time t5, and after a quenching delay time toff elapses, the light output P of the light signal begins to drop from a time t6, and becomes approximately zero at a time t8.

In the Specification, a rise time tr (ns) is defined as a time for the light output P of the light signal to increase from 10% to 90% of the peak value Pm, and a fall time tf (ns) is defined as a time for the light output P of the light signal to decrease from 90% to 10% of the peak value Pm.

The light emitting delay time ton is expressed as a time for the light output P to reach from zero to 10% of the peak value Pm, and the quenching delay time toff is expressed as a time for the light output P to decrease from the peak value Pm to 90% of the peak value Pm.

The light emitting delay time ton and the quenching delay time toff mainly depend on the junction capacitance of the light emitting layer 25. Larger thickness of the barrier layer 27 to decrease the junction capacitance causes the shorter light emitting delay time ton and the shorter quenching delay time toff. Since the input electric signal Vin of an optical coupling device often rises from zero (a bias voltage or a bias current is not applied in advance) as shown in FIG. 3, it is preferable that the junction capacitance is small.

On the other hand, the rise time tr and the fall time tf mainly depend on lifetimes of carriers, and on the like.

The property of the semiconductor light emitting device with the well layers 26 (the number n of the layers is 2) and the barrier layers 27 (the number (n+1) of the layers is 3) as the quantum well structure shown in FIG. 2B will be described. In addition, when each of the well layers 26 has a thickness of not more than 10 nm, it is possible to keep the quantum efficiency high. In the following, it is assumed that thicknesses Tw1 and Tw2 of the well layers 26 are 5 nm, respectively. And it is assumed that all the thicknesses Tb1, Tb2, Tb3 of the barrier layers 27 are the same. Furthermore, the quantum well structure of the embodiment is not limited in particular.

Figure 4:
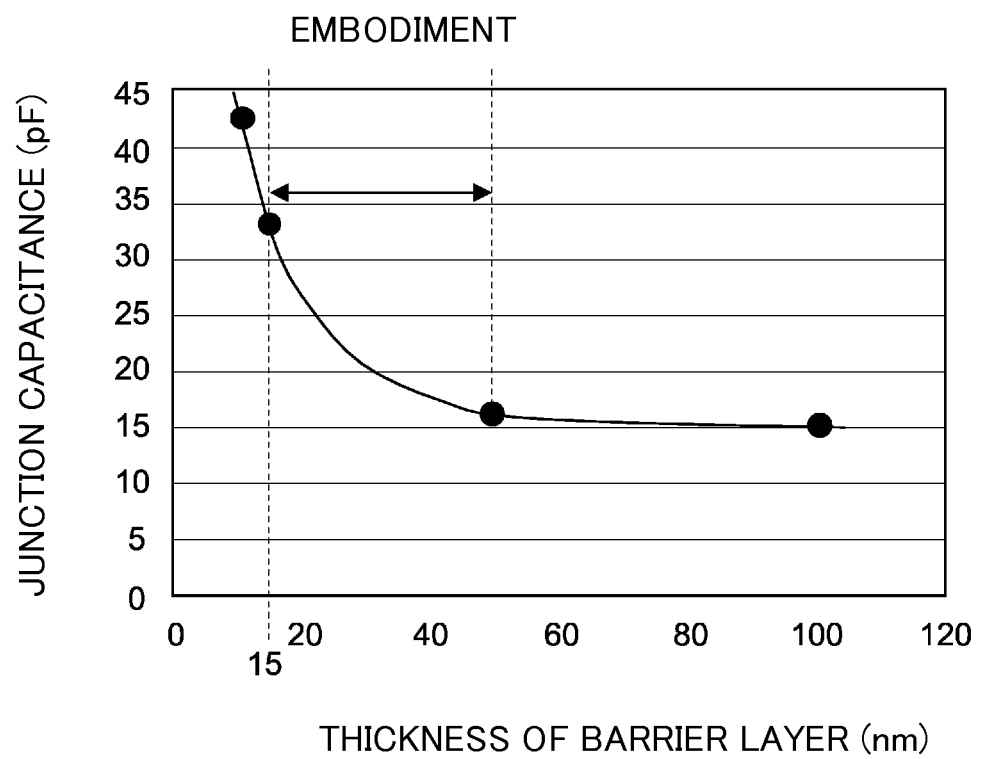
FIG. 4 is a graph showing a dependence of a junction capacitance on a thickness of a barrier layer.

FIG. 4 is a graph showing a dependence of a junction capacitance on a thickness of the barrier layer.

The vertical axis is a junction capacitance (measured at 1 MHz) between the p-type clad layer and the n-type clad layer at a zero bias voltage, and the horizontal axis is a thickness (nm) of the barrier layer.

The junction capacitance is as large as approximately 43 pF when the thickness of each of the barrier layers 27 is 10 nm. The junction capacitance is reduced to approximately 33.7 pF when the thickness of each of the barrier layers 27 is 15 nm. The junction capacitance is reduced to approximately 16.4 pF when the thickness of each of the barrier layers 27 is 50 nm. The junction capacitance is approximately 15 pF when the thickness of each of the barrier layers 27 is 100 nm. The difference between the junction capacitances of this case and a case in which the thickness of each of the barrier layers 27 is 50 nm becomes small. That is, when the thickness of the barrier layer 27 is not less than 15 nm, the light emitting delay time ton is shortened.

Figure 5:
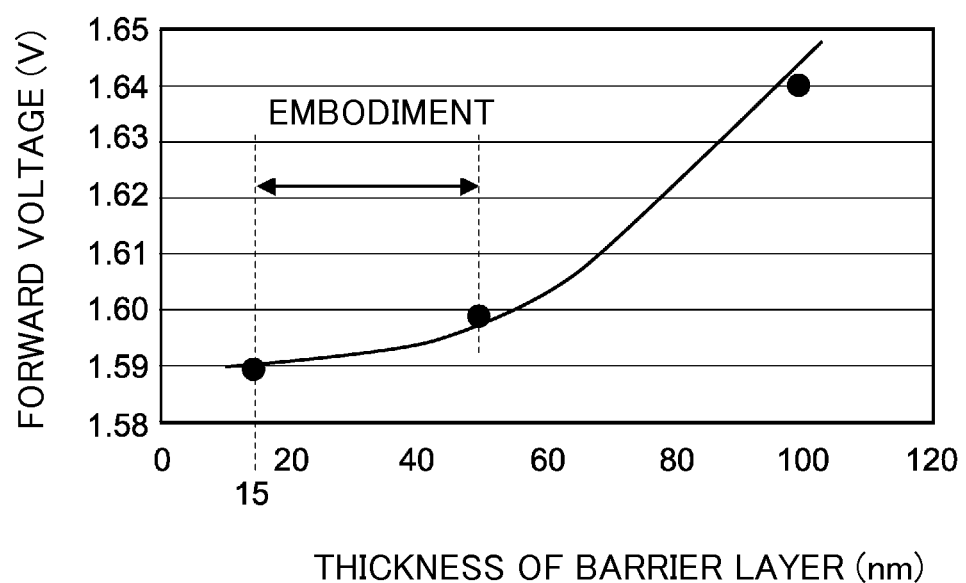
FIG. 5 is a graph showing a dependence of a forward voltage on the thickness of the barrier layer.

FIG. 5 is a graph showing a dependence of a forward voltage VF on the thickness of the barrier layer.

The vertical axis is a forward voltage (V) at a current of 10 mA, and the horizontal axis is a thickness (nm) of the barrier layer 27. The forward voltage VF is 1.59 V when the thickness of each of the barrier layers 27 is 15 nm. The forward voltage VF is 1.6 V when the thickness of each of the barrier layers 27 is 50 nm. The forward voltage VF is 1.64 V when the thickness of each of the barrier layers 27 is 100 nm. However, the forward voltage VF begins to rapidly increase when the thickness of each of the barrier layers 27 becomes not less than 100 nm. That is, the barrier layers 27 each having the thickness of not more than 50 nm enables the power consumption to be reduced.

Figure 6:
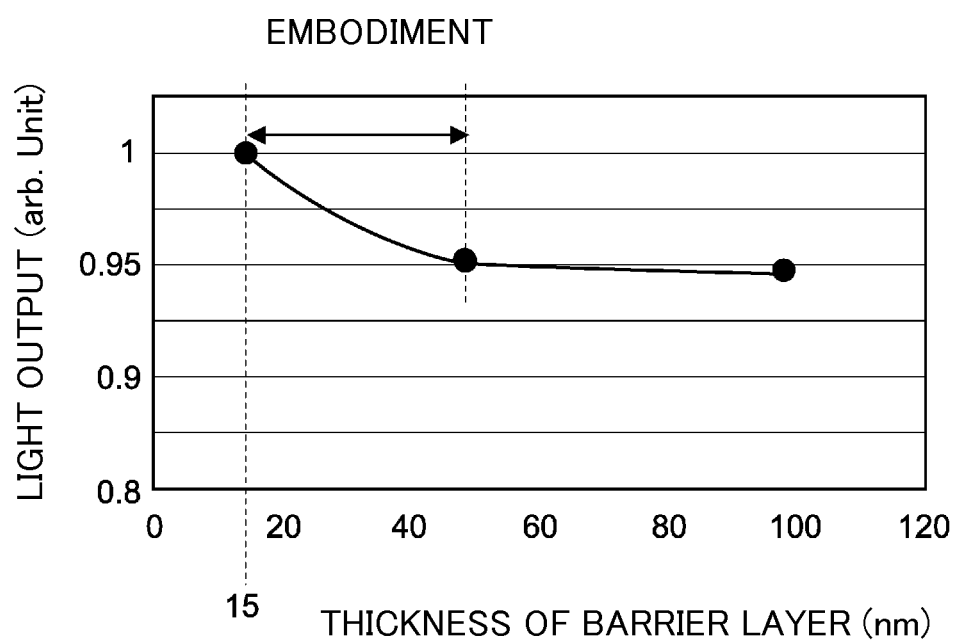
FIG. 6 is a graph showing a dependence of a light output on the thickness of the barrier layer.

FIG. 6 is a graph showing a dependence of a light output on the thickness of the barrier layer.

In addition, it is assumed that the device in this case has the same configuration as in the case of FIG. 4. The vertical axis is a relative light output, and the horizontal axis is a thickness (nm) of the barrier layer 27. The difference between the light output when the thickness of each of the barrier layers 27 is 15 nm and the light output when each of the barrier layers 27 is 50 nm is kept as small as approximately 5%.

Figure 7A:
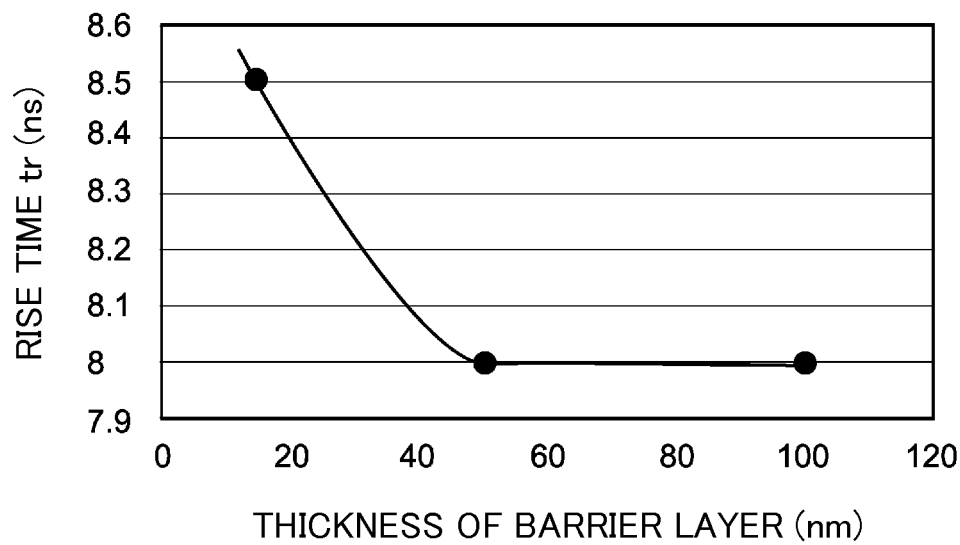
FIG. 7A is a graph showing a dependence of a rise time on the thickness of the barrier layer.
Figure 7B:
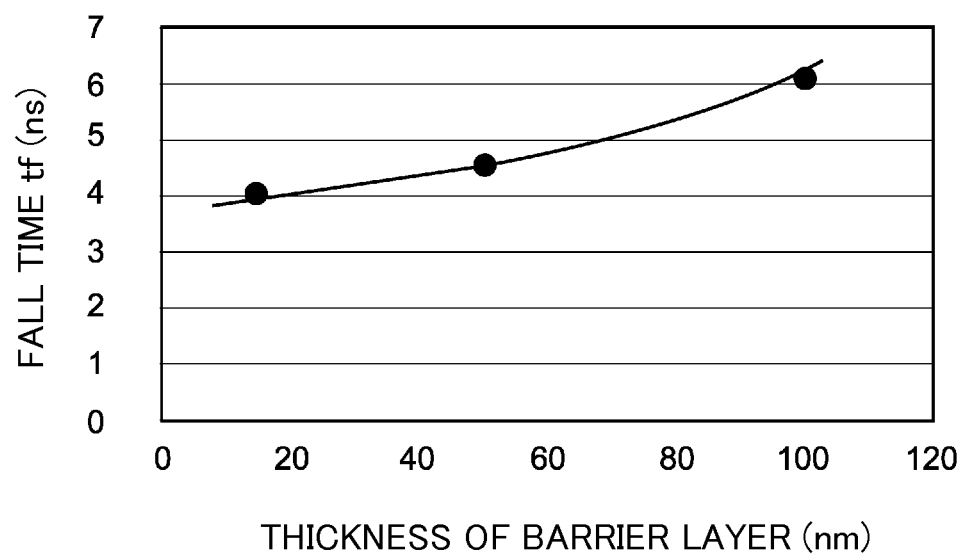
FIG. 7B is a graph showing a dependence of a fall time on the thickness of the barrier layer.

FIG. 7A is a graph showing a dependence of the rise time tr on the thickness of the barrier layer, and FIG. 7B is a graph showing a dependence of the fall time tf on the thickness of the barrier layer.

When the thickness of each of the barrier layers 27 is 15 to 50 nm, the rise time tr is kept as short as 8 to 8.5 ns, and the fall time tf is kept as short as 4 to 4.3 ns.

In addition, the properties shown in FIGS. 4, 5, 6, 7A and 7B are for the case in which the well layer 26 is non-doped $Al_{0.06}Ga_{0.94}As$, and the barrier layer 27 is non-doped $Al_{0.5}Ga_{0.5}As$. But also for the case in which the well layer 26 and the barrier layer 27 are respectively $In_xAl_yGa_{1-x-y}As$ ($0 \leq x < 1$, $0 \leq y \leq 1$, $x+y \leq 1$), for example, the approximately same effect can be obtained.

Since the semiconductor light emitting device 10 of the embodiment can raise the response speed while keeping the consumption current low by keeping the light output P within a prescribed range and reducing the chip size, it becomes easy to make a light coupling device with a small size, a low consumption power and a high response speed.

Figure 8:
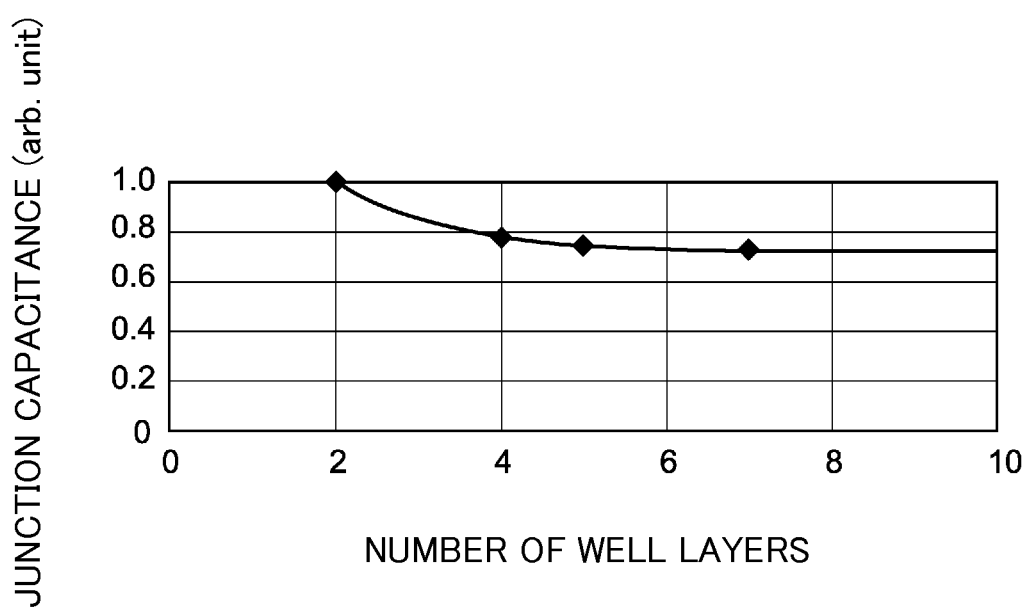
FIG. 8 is a graph showing a dependence of a junction capacitance on the number of a well layer.

FIG. 8 is a graph showing a dependence of a junction capacitance on the number of the well layers in the embodiment.

The vertical axis indicates a relative junction capacitance, and the horizontal axis indicates the number of the well layers 26. The number of the barrier layers 27 is the number of the well layers+1. It is assumed that the thickness of each of the barrier layers 27 is 15 nm. In FIG. 4, the junction capacitance is approximately 33.7 pF when the thickness of the barrier layer 27 is 15 nm. The relative junction capacitance is indicated in FIG. 8. The relative junction capacitance is 1 when the thickness of the barrier layer 27 is 15 nm.

The relative junction capacitance is approximately 0.8 when the number of the well layers is 4 (the number of the barrier layers is 5), and the relative junction capacitance decreases to approximately 0.75 when the number of the well layers is 7 (the number of the barrier layers is 8), but the ratio of the decrease becomes gradual. That is, it is preferable that the number of the well layers is not less than 1 and not more than 10.

Figure 9:
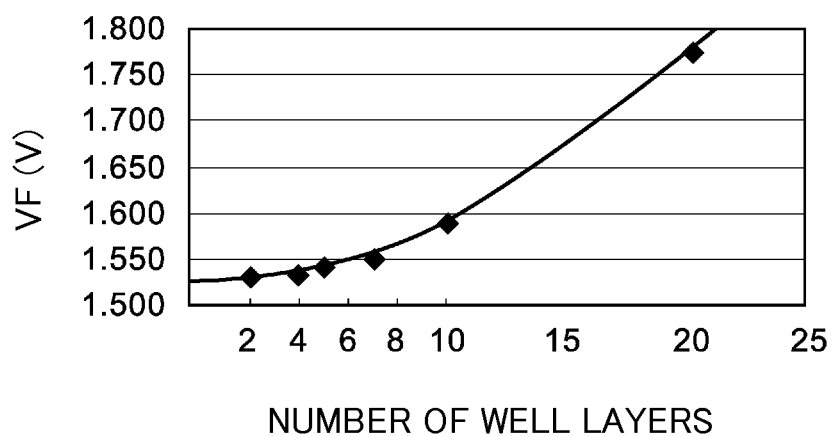
FIG. 9 is a graph showing a dependence of a forward voltage on the number of the well layer.

FIG. 9 is a graph showing a dependence of the forward voltage VF on the number of the well layers in the embodiment.

It is assumed that the thickness of the barrier layer 27 is 15 nm. The forward voltage VF at the forward current of 10 mA is approximately 1.59 V when the number of the well layers is 10. However, the forward voltage VF becomes as high as approximately 1.774 V when the number of the well layers becomes 20. That is, it is preferable that the number of the well layers is e not less than 1 and not more than 10.

Figure 10:
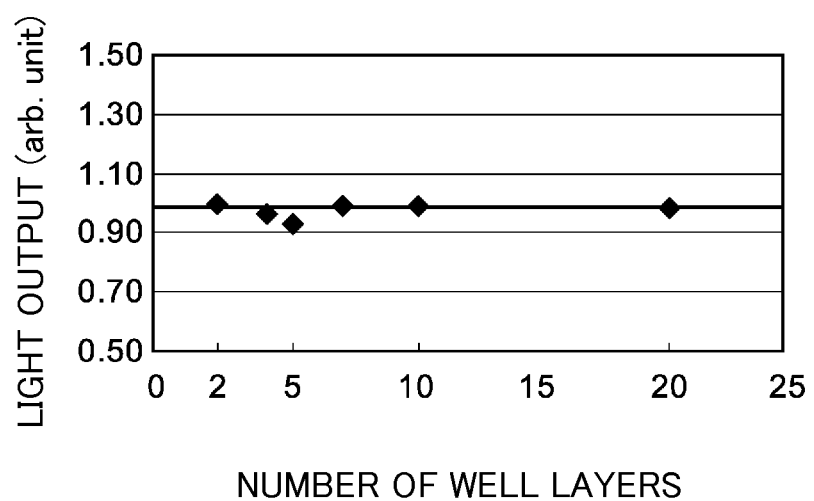
FIG. 10 is a graph showing a dependence of a light output on the number of the well layer.

FIG. 10 is a graph showing a dependence of a relative light output on the number of the well layers in the embodiment. In addition, it is assumed that the thickness of the barrier layer 27 is 15 nm.

In the range in which the number of the well layers is 1 to 20, the relative light output keeps the range of 0.93 to 1 compared with the case in which the number of the well layers is 2, and does not greatly change.

Figure 11:
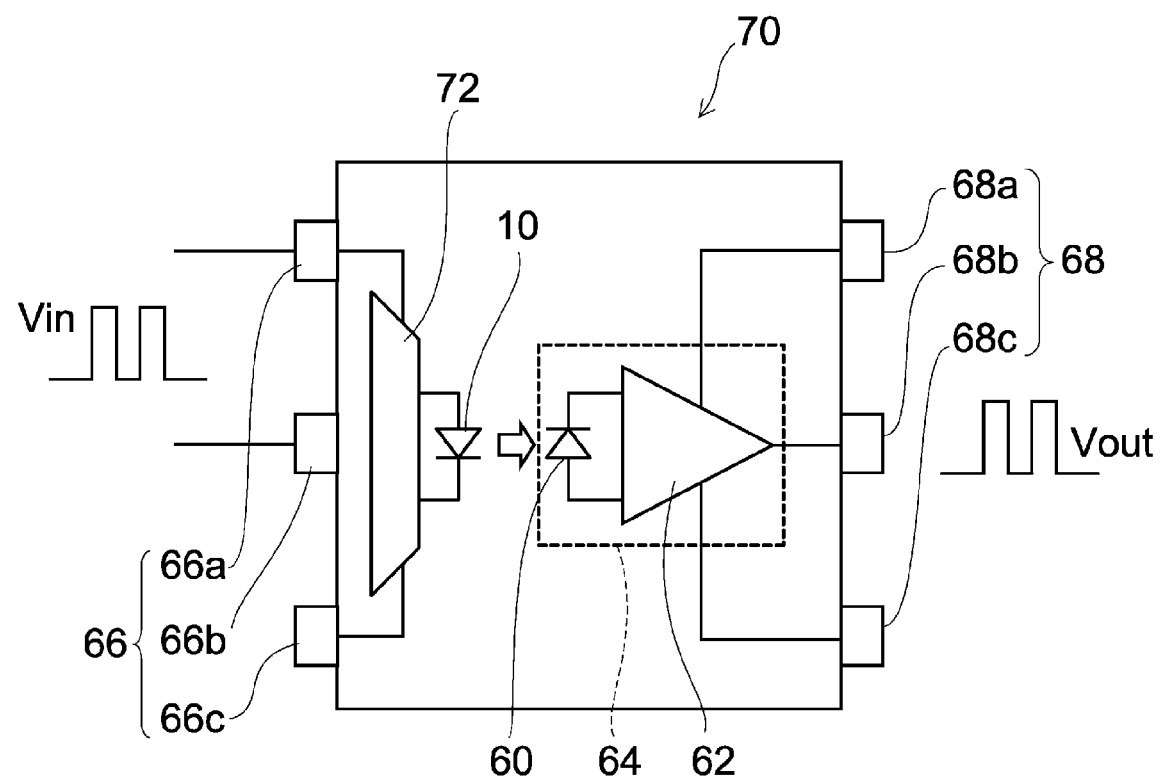
FIG. 11 is a diagram showing a configuration of a light coupling device with the semiconductor light emitting device according to the embodiment.

FIG. 11 is a diagram showing a configuration of a light coupling device with the semiconductor light emitting device of the embodiment.

A light coupling device 70 includes the semiconductor light emitting device 10 of the embodiment, a silicon light receiving device 60, and a light receiving circuit 62. The light receiving circuit 62 may include a photo detector, a transimpedance amplifier, and the like. A photo IC 64 into which the silicon light receiving device 60 and the light receiving circuit 62 are integrated enables the light coupling device 70 to be miniaturized. The light coupling device 70 may also include mounting members, a sealing resin layer, and a light blocking resin layer.

The semiconductor light emitting device 10 is driven by the input electric signal Vin such as a modulation signal. The modulation signal may be an analog signal, a PWM (Pulse Width Modulation) signal, a PFM (Pulse Frequency Modulation) signal, a PCM (Pulse Code Modulation) signal, and the like.

Since the silicon light receiving device 60 has a maximum value of the light receiving sensitivity in the wavelength range of 700 to 800 nm, the silicon light receiving device 60 receives with high sensitivity the light emitted from the semiconductor light emitting device 10, the light having a peak wavelength of 650 to 1000 nm. The silicon light receiving device 60 converts the received light into an electric signal and outputs the electric signal. In addition, it is preferable to provide a light blocking layer in order to suppress the malfunction by external light.

In the light coupling device 70, input terminals 66 (66a, 66b, 66c) of the semiconductor light emitting device 10, and output terminals 68 (68a, 68b, 68c) at the silicon light receiving device 60 and the light receiving circuit 62 side are electrically insulated. The signal transmission is mutually enabled between electronic devices which are driven by different voltage source systems, such as a DC voltage system, an AC power source system, a phone line system, and the like.

In the light coupling device 70, since the junction capacitance of the semiconductor light emitting device 10 is reduced, it is easy to raise the response speed. The light coupling device 70 with the semiconductor light emitting device 10 having the properties shown in FIGS. 4, 5, 6, 7A, and 7B can easily respond even to the input electric signal Vin of a repetition frequency of 100 MHz. In addition, the pulse width distortion is sufficiently reduced in an output electric signal Vout.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light emitting device, employed to a light coupling device, comprising:
    a semiconductor substrate;
    a semiconductor body provided on the semiconductor substrate and including a p-type clad layer, a n-type clad layer, and a light emitting layer provided between the p-type clad layer and the n-type clad layer, the light emitting layer including a quantum well structure stacked alternately n, an integer of not less than 1, well layers and (n+1) barrier layers, each of the well layers having a thickness of smaller than 15 nm, and each of the barrier layers having a thickness of 15 nm to 50 nm, wherein
    a junction capacitance between the p-type clad layer and the n-type clad layer is 16.4 pF to 33.7 pF,
    the light emitting layer emits light with a peak wavelength of 650 nm to 1000 nm,
    the light has a rise time of 8 ns to 8.5 ns and a fall time of 4 ns to 4.3 ns to an input signal with a frequency of 100 MHz.

2. The semiconductor light emitting device according to claim 1, wherein the n is an integer of 1 to 10.

3. The semiconductor light emitting device according to claim 1, wherein
    the semiconductor body includes a Bragg reflector which is provided between the light emitting layer and the semiconductor substrate to reflect the light.

4. The semiconductor light emitting device according to claim 1, wherein
    the semiconductor substrate is a GaAs substrate.

5. The semiconductor light emitting device according to claim 1, wherein
    the light emitting layer is made up of $In_xAl_yGa_{1-x-y}As$ ($0 \leq y \leq 1$, $x+y \leq 1$).

6. The semiconductor light emitting device according to claim 5, wherein the n is an integer of 1 to 10.

7. The semiconductor light emitting device according to claim 5, wherein
    the semiconductor body includes a Bragg reflector which is provided between the light emitting layer and the semiconductor substrate to reflect the light.

8. A light coupling device, comprising:
    a semiconductor light emitting device according to one of claims 1 to 7; and
    a light receiving device which receives the light to convert into an electric signal and outputs the electric signal.

* * * * *